United States Patent

Lin et al.

[11] Patent Number: 6,100,544
[45] Date of Patent: *Aug. 8, 2000

[54] LIGHT-EMITTING DIODE HAVING A LAYER OF ALGAINP GRADED COMPOSITION

[75] Inventors: Kun-Chuan Lin, Taipei; Lung-Chien Chen, Toa-Yuan Hsien, both of Taiwan

[73] Assignee: Visual Photonics Epitaxy Co., Ltd., Tao-Yuan, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/081,760

[22] Filed: May 20, 1998

[51] Int. Cl.$^7$ ...................................... H01L 33/00
[52] U.S. Cl. .................. 257/94; 257/96; 257/97; 257/103; 438/46; 438/47; 372/44; 372/45
[58] Field of Search ................ 257/94, 96, 97, 257/103; 438/46, 47; 372/44, 45

[56] References Cited

U.S. PATENT DOCUMENTS

| | | | |
|---|---|---|---|
| 5,003,548 | 3/1991 | Bour et al. | 372/44 |
| 5,008,718 | 4/1991 | Flectcher et al. | 357/17 |
| 5,218,613 | 6/1993 | Serreze | 372/45 |
| 5,233,204 | 8/1993 | Flectcher et al. | 357/17 |
| 5,458,085 | 10/1995 | Kondo et al. | 117/104 |
| 5,714,014 | 2/1998 | Horikawa | 148/33 |
| 5,744,829 | 4/1998 | Murasato et al. | 257/94 |

FOREIGN PATENT DOCUMENTS

| | | |
|---|---|---|
| 406085385 | 3/1994 | Japan . |
| 411017269 | 1/1999 | Japan . |

*Primary Examiner*—William Mintel

[57] ABSTRACT

A light emitting diode includes a double hetero structure containing an upper cladding layer with a graded composition. The light emitting diode comprises a GaAs substrate, a first ohmic contact to the substrate, an AlGaInP lower cladding layer formed on the GaAs substrate, an AlGaInP active layer formed on the lower cladding layer, an AlGaInP upper cladding layer formed on the active layer and a second ohmic contact. The AlGaInP upper cladding layer has a graded composition which increases the LED brightness and decreases the forward bias voltage of the light emitting diode. The graded composition can also be used in the upper semiconducting layer of a conventional p-n junction light emitting diode.

19 Claims, 7 Drawing Sheets

LIGHT-EMITTING DIODE HAVING A LAYER OF ALGAINP GRADED COMPOSITION

FIELD OF THE INVENTION

This invention relates to a light-emitting diode (LED) having a double hetero structure which contains a second cladding layer with a graded composition, and to a light-emitting diode containing an upper semiconducting layer with a graded composition for increasing the brightness and decreasing the forward bias voltage ($V_f$).

BACKGROUND OF THE INVENTION

Light emitting diodes (LEDs) having a semiconductor light generation region situated on a light absorbing substrate are widely used as light sources and are beginning to replace incandescent lamps. In order to meet the demands for light output, it is important that the overall light output efficiency of the LEDs be maximized. One improvement made in the prior art, disclosed in U.S. Pat. No. 5,008,718 is to increase the LED electrical efficiency by including a thin electrically conductive transparent window layer between the light generation region and the top metal contact so that current crowding is minimized. An unfortunate shortcoming of the thin window layer is that a significant portion of the total light generated from the light generation region is internally reflected within the window layer and is absorbed by the substrate instead of being emitted out of the LED. U.S. Pat. No. 5,233,204 disclosed a light-emitting diode with a thick transparent layer. However, the disclosed LED still has a $V_f$ value greater than 1.9 volts, which means that the working voltage of the LED is too high to be used in current portable electrical equipment, such as cellular telephone, notebook computer, portable stereo, etc. It consumes a large amount of electrical energy.

SUMMARY OF THE INVENTION

It is an object of the present invention to provide a light-emitting diode having a double hetero structure which contains a second cladding layer with a graded composition of $(Al_xGa_{1-x})_yIn_{1-y}P$ in which $0.05 \leq x \leq 0.9$ and $0.1 \leq y \leq 0.95$. A lower cladding layer $(Al_zGa_{1-z})_{0.5}In_{0.5}P$ ($0.3 \leq z \leq 0.9$) is first grown on top of a GaAs substrate. An active layer $(Al_wGa_{1-w})_{0.5}In_{0.5}P$ ($0 \leq w \leq 0.5$) is grown above the lower cladding layer. The second cladding layer is then formed on top of the active layer. By means of the second cladding layer of $(Al_xGa_{1-x})_yIn_{1-y}P$, the emitted of light from the surface of the light-emitting diode increases and the crowding effect is improved. The $V_f$ value of the LED device of the present invention is equal to or less than that of conventional LEDs.

It is another object of the present invention to provide a light-emitting diode which contains an upper semiconducting layer with a graded composition of $(Al_xGa_{1-x})_yIn_{1-y}P$, wherein $0.05 \leq x \leq 0.9$, $0.1 \leq y \leq 0.95$. The light-emitting diode contains a substrate, a lower semiconducting layer grown on top of the substrate, the upper semiconducting layer having a graded composition of $(Al_xGa_{1-x})_yIn_{1-y}P$, and two ohmic contacts. By means of the upper semiconducting layer with a graded composition of $(Al_xGa_{1-x})_yIn_{1-y}P$, the brightness of the LED increases and the $V_f$ value of the present invention is equal to or less than that of the conventional LEDs.

BRIEF DESCRIPTIONS OF THE DRAWINGS

DETAILED DESCRIPTIONS OF THE INVENTION

U.S. Pat. Nos. 5,008,718 and 5,233,204 disclose light-emitting diodes having a transparent window layer which improves the crowding effect of conventional LEDs and increases the amount of the emitted light from the surface of the LEDs. Thus, the brightness of the emitted from light the LEDs significantly increases.

Figure 1A:
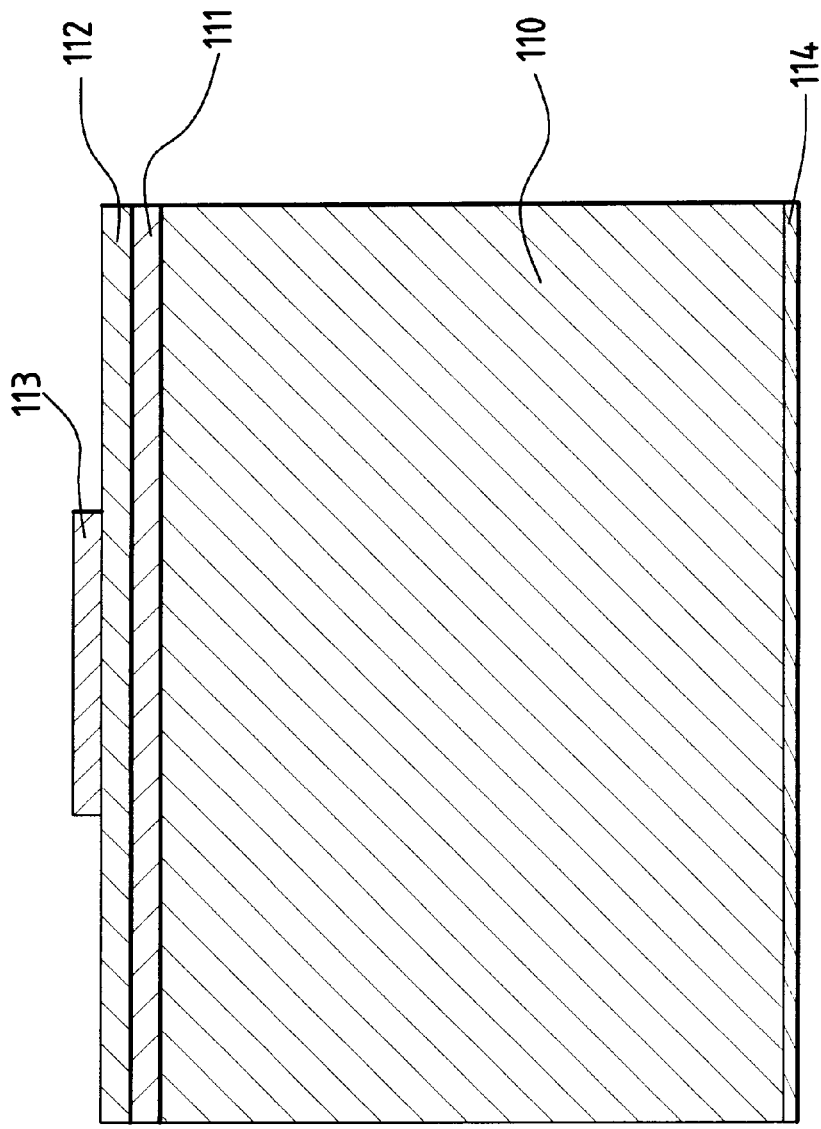
FIGS. 1A and 1B are cross-sectional views of first and second conventional light-emitting diodes.
Figure 1B:
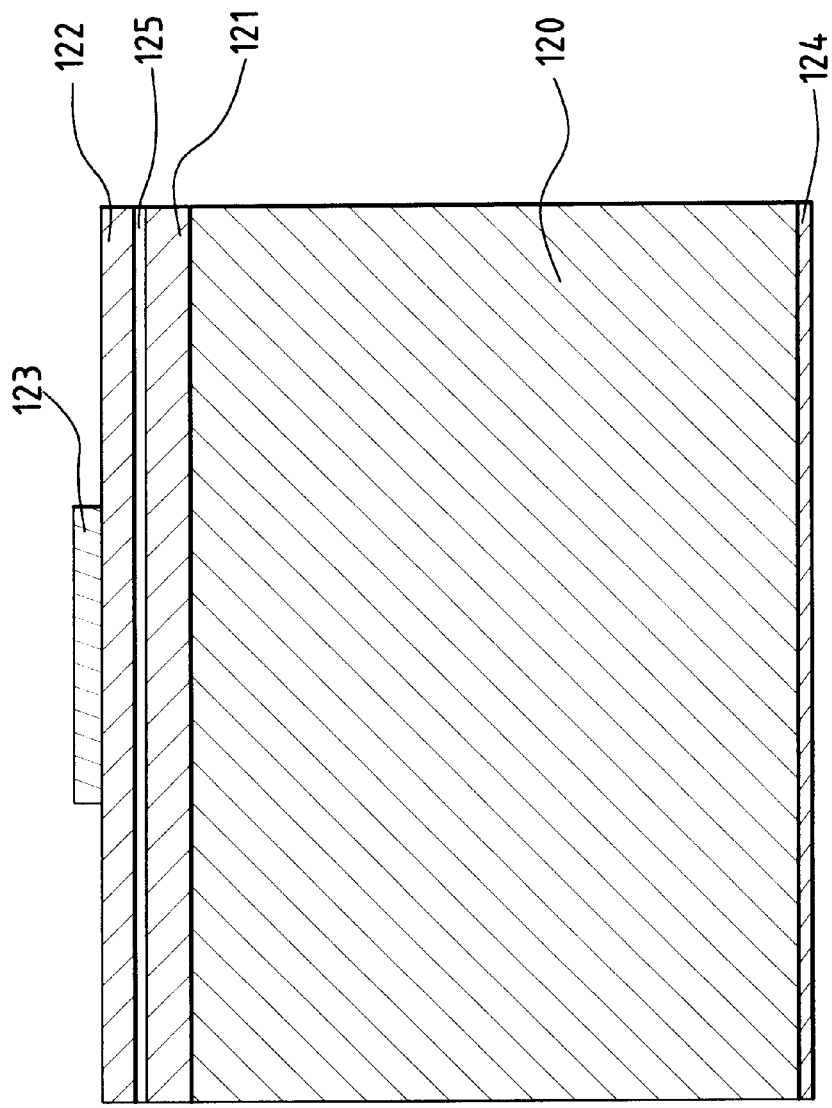
Figure 2A:
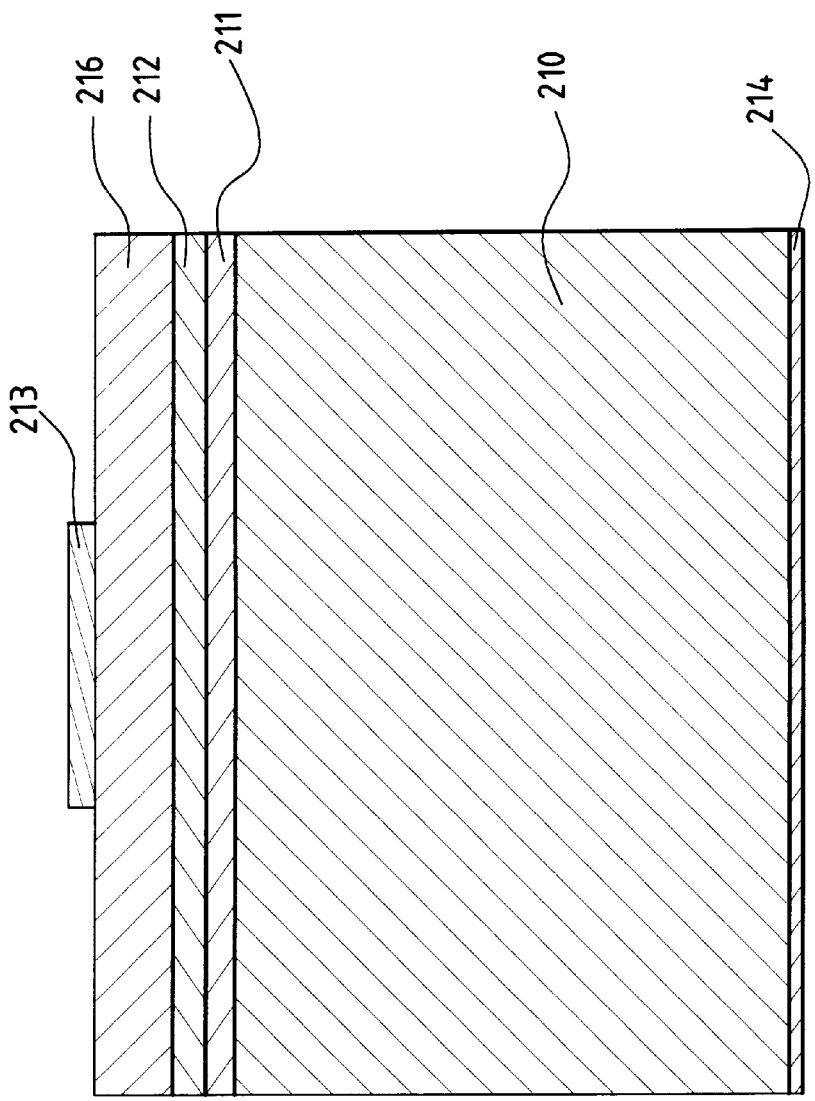
FIGS. 2A and 2B are cross-sectional views of third and fourth conventional light-emitting diodes.
Figure 2B:
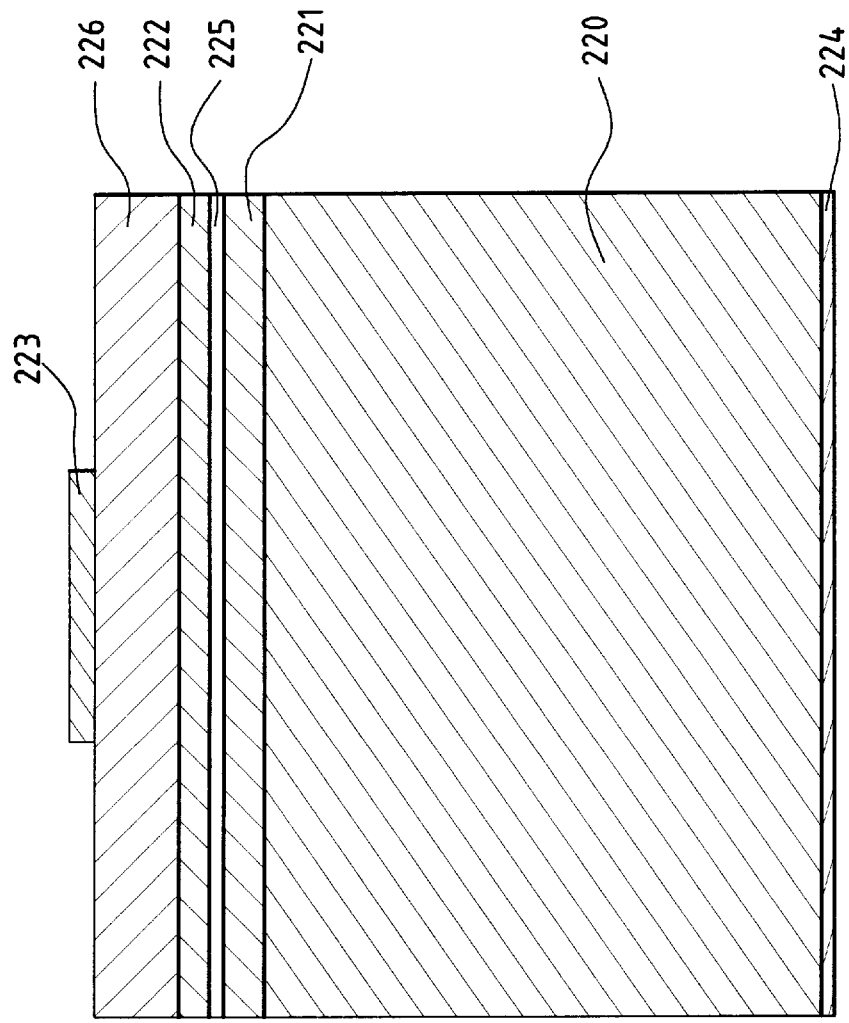

FIGS. 1A and 1B are cross-sectional views of conventional LEDs. FIG. 1A is a homo structure of an LED which comprises a substrate 110, a first ohmic contact 114 to the substrate 110, a first type conductivity material 111, such as n-AlGaInP, formed on top of the substrate 110, a second type conductivity material 112, such as p-AlGaInP, formed on the first type conductivity material 111, and a second ohmic contact 113 to the second type conductivity material 112. FIG. 1B shows a double hetero structure of a conventional LED which is similar to that of the LED of FIG. 1A except that an active layer 125 is formed between a second type semiconducting layer 122, such as p-AlGaInP, and a first type semiconducting layer 121, such as n-AlGaInP. The energy gap of the active layer 125 is smaller than those of the first and second type semiconducting layers 121, 122 so as to provide a carrier confinement effect to confine electrons and holes in the active layer 125. Thus, the electrons and holes recombine in the active layer 125 to emit light. The first and second semiconducting layers 121,122 are named as lower cladding and upper cladding layers. The external quantum efficiency of the above LEDs of FIGS. 1A and 1B is not high because of some factors, such as, current crowding effect, incident light critical angle, re-absorbing inside the LEDs. Therefore, U.S. Pat. Nos. 5,008,718 and 5,233,204 disclose LED structures having a transparent window layer in order to increase the external quantum efficiency of the LEDs as shown in FIGS. 2A and 2B. In FIGS. 2A and 2B, transparent window layers 216 and 226 are grown respectively on the LEDs of FIGS. 1A and 1B. The materials of the transparent window layers 216 and 226 are Gap, GaAsP, or AlGaAs which have energy gaps greater than that of AlGaInP light-generating layer. Although, by means of the transparent window layer, the brightness of the LEDs increases, and the forward bias voltage $V_f$ increases because a bandgap discontinuity problem ($\Delta E_c$ and $\Delta E_v$) arises due to a hetero junction which is formed between the transparent window layer and the upper cladding layer or the second type semiconducting layer of the LED. Thus, the power consumption of the LEDs increases. The forward bias voltage $V_f$ is defined as the voltage value measured when a forward current of 20 mA is applied to the LEDs. In order to solve the bandgap discontinuity problem of large $V_f$ value, the present invention provides the LED having an upper cladding layer of a graded composition.

In FIG. 2A, the numeral 210 is a substrate. Numeral 213 is an ohmic contact. Numeral 214 is an ohmic contact. Numeral 212 is a second type conductivity material.

In FIG. 1B, the numerals 123 and 124 are ohmic contacts. Numeral 120 is a substrate.

In FIG. 2B, the numerals 223 and 224 are ohmic contacts. Numeral 222 is a p-type confining layer. Numeral 225 is an active layer. Numeral 221 is an n-type confining layer. Numeral 220 is a substrate.

In the present invention, all the layers, such as, a first cladding layer 311, a second cladding layer 317, an active layer 315, an upper semiconducting layer 517, a lower semiconducting layer 511, etc. are grown using metal-organic chemical vapor deposition (MOCVD). The temperature of MOCVD is from 500 to 750° C. and the pressure is from 100 to 300 mbar.

Figure 3:
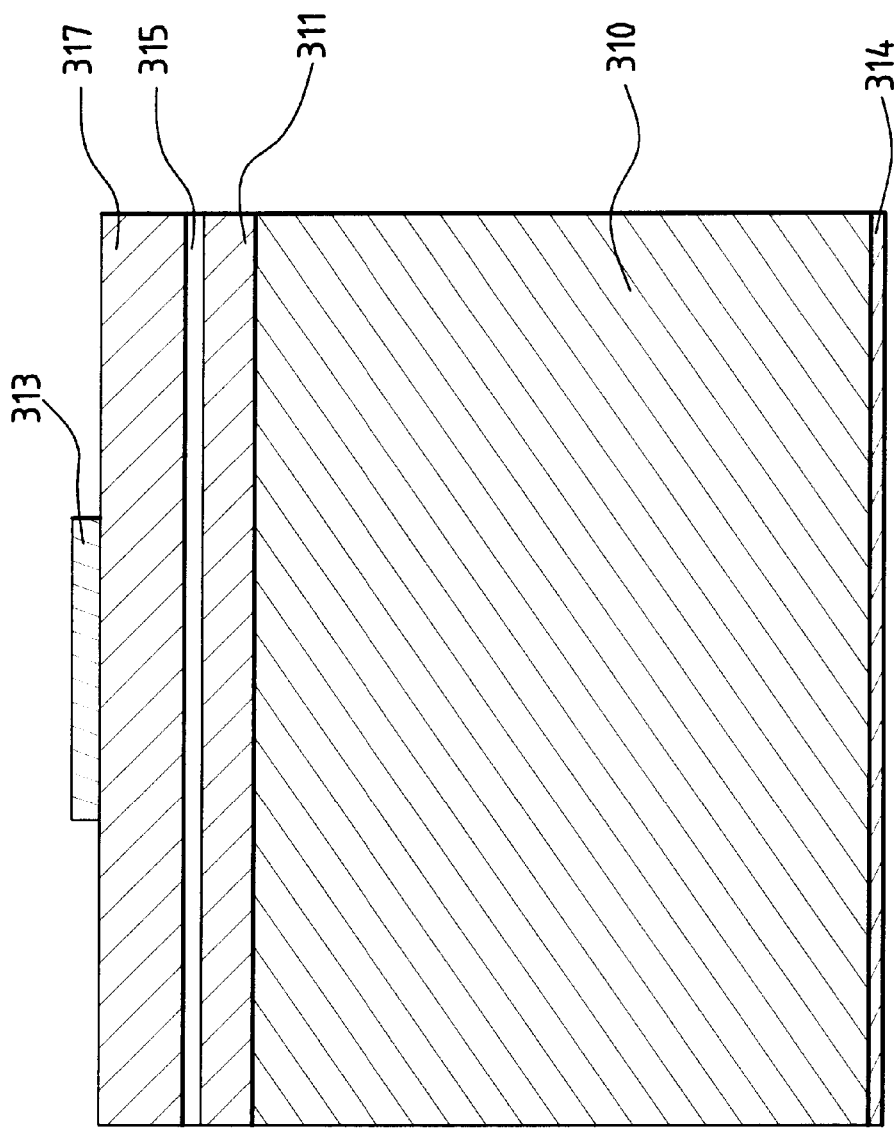
FIG. 3 is a cross-sectional view of a first embodiment of light-emitting diodes of the present invention.
Figure 4:
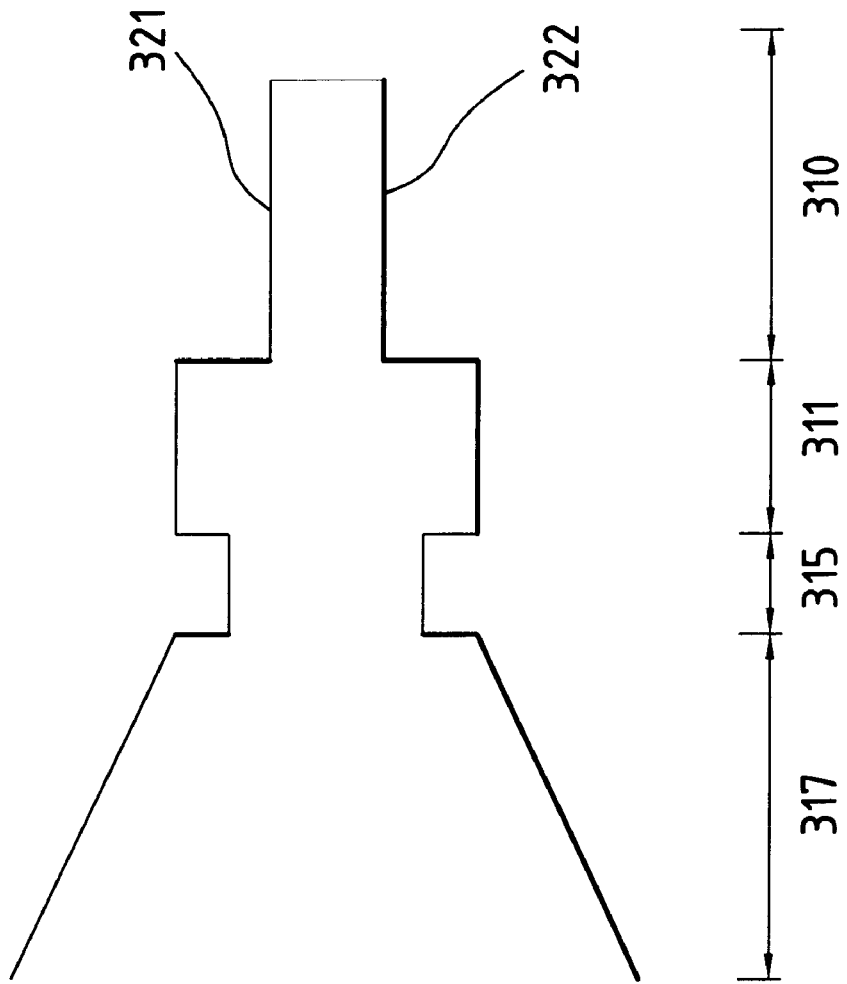
FIG. 4 is an energy band diagram of the first embodiment of FIG. 3.

As shown in FIG. 3, according to the first embodiment of the present invention, the substrate 310 is an n-type GaAs. An n-type AlGaInP first cladding layer 311 is formed on the substrate 310. A p-type AlGaInP active layer 315 is grown on the first cladding layer 311. A p-type AlGaInP second cladding layer 317 having a graded composition is then formed on top of the active layer 317 in order to form a double hetero structure. In the first embodiment of the present invention, the n-type dopant is Te and the p-type dopant is Mg. The schematic view of the energy band of the first embodiment of LED is shown in FIG. 4 in which the dimension is not drawn to the scale of the layer thickness and energy gap of the real LED. Numeral 321 is the conduction band and numeral 322 is the valence band as shown in FIG. 4. First and second ohmic contacts 314 and 313 are contact metal layers which are formed on the lower and upper surfaces of the LED.

In the first embodiment of the present invention, the thickness of the GaAs substrate 310 is between 250 $\mu$m and 450 $\mu$m, preferably 350 $\mu$m±20 $\mu$m. The typical thickness of the first cladding layer 311 is between 0.1 $\mu$m and 1.5 $\mu$m, preferably 0.8 $\mu$m. The thickness of the active layer 315 is between 2.8 $\mu$m and 0.9 $\mu$m, preferably 1.6 $\mu$m. The thickness of the second cladding layer 317 is between 2 $\mu$m and 15 $\mu$m.

In view of the composition of various layers of the first embodiment of the present invention, the first cladding layer 311 is $(Al_{0.7}Ga_{0.3})_{0.5}In_{0.5}P$ and the active layer 315 is $(Al_{0.3}Ga_{0.7})_{0.5}In_{0.5}P$. The composition of the second cladding layer 317 is gradually changed from $(Al_{0.7}Ga_{0.3})_{0.5}In_{0.5}P$ at the junction between the active layer 315 and the second cladding layer 317 to $(Al_{0.1}Ga_{0.9})_{0.9}In_{0.1}P$ at the junction between the second cladding layer 317 and the second ohmic contact 313. A lattice match occurs between $(Al_{0.7}Ga_{0.3})_{0.5}In_{0.5}P$ or $(Al_{0.3}Ga_{0.7})_{0.5}In_{0.5}P$ and the GaAs substrate 310. The lattice mismatch between the $(Al_{0.1}Ga_{0.9})_{0.9}In_{0.1}P$ and the GaAs substrate 310 is about 2.78%. Generally, the greater the thickness of the second cladding layer 317 is, the better the current spreading effect of the LED is. Thus, the amount of light emitted from the edge of the LED increases. However, if the other factors, such as, growth time and cost of the second cladding layer 317, are considered, the thickness of the second cladding layer 317 should not be very thick. Preferably the thickness is between 2 $\mu$m and 30 $\mu$m.

The active layer 315 of the first embodiment of the present invention is a well-known layer which may be a single layer quantum well (SQW) or multiple layer quantum wells (MQW). The active layer 315 may be n-type or p-type.

The AlGaInP layer having a graded composition may be applied to the LEDs with a conventional homo p-n structure or a single hetero structure. The manufacture process for the LEDs having a graded composition in the upper cladding layer is simple and cheap. If the upper layer representing the second conductivity type semiconducting layer is replaced by the AlGaInP layer having a graded composition, the brightness of the LED is improved and the $V_f$ value is retained or decreased.

Figure 5:
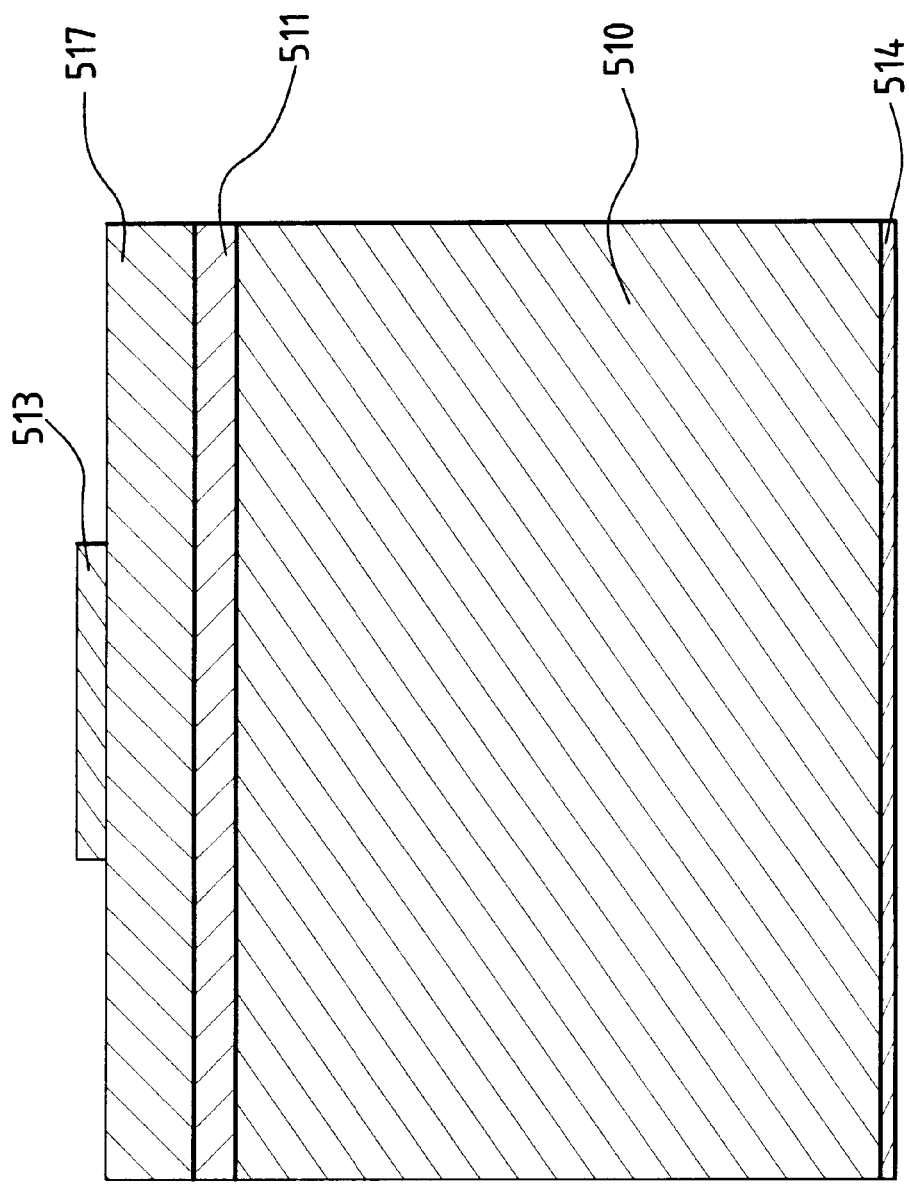
FIG. 5 is a cross-sectional view of a second embodiment of light-emitting diodes of the present invention.

The second embodiment of the present invention is shown in FIG. 5. The LED of the second embodiment contains a GaAs substrate 510 of a first conductivity type, a lower semiconducting AlGaInP layer 511 of a first conductivity type grown on the substrate 510, and an upper semiconducting AlGaInP layer 517 of a second conductivity type AlGaInP grown on the lower semiconducting layer 511. A second ohmic contact 513 is deposited on top of the upper semiconducting layer 517. A first ohmic contact 514 is formed on the substrate 510. The composition of the upper semiconducting layer 517 of the second conductivity type is gradually changed from $(Al_{0.3}Ga_{0.7})_{0.5}In_{0.5}P$ at the junction between the lower semiconducting layer 511 and the upper semiconducting layer 517 to $(Al_{0.1}Ga_{0.9})_{0.9}In_{0.1}P$ at the junction between the upper semiconducting layer 517 and the second ohmic contact 513. The composition of the lower semiconducting layer 511 of the first conductivity type is $(Al_{0.3}Ga_{0.7})_{0.5}In_{0.5}P$.

In the present invention, the MOCVD technique is used. However, the layers may be formed by other techniques, such as, MBE, VPE, and LPE. Different materials, thickness and deposition conditions can also be used in the present invention.

While the invention has been particularly shown and described with reference to these preferred embodiments, it will be understood by those skilled in the art that various changes in form and details may be made without departing from the spirit and scope of the invention. Although only the preferred embodiments of this invention were shown and described in the above description, it is requested that any modification or combination that comes within the spirit of this invention be protected.

What is claimed is:

1. A light-emitting diode having a double hetero structure comprising:
   a semiconductor substrate of a first conductivity type;
   a first ohmic contact to said semiconductor substrate;
   a first cladding layer of said first conductivity type formed on said semiconductor substrate;
   an active layer formed on said first cladding layer, said active layer being lattice-matched with said semiconductor substrate;
   a second cladding layer of a second conductivity type having a graded AlGAlnP composition formed on said active layer, said graded AlGAlnP composition gradually changing from being lattice-matched to lattice-mismatched with said semiconductor substrate; and
   a second ohmic contact formed on said second cladding layer.

2. The light-emitting diode having a double hetero structure as claimed in claim 1, wherein said graded AlGaInP composition of said second cladding layer gradually changes from $(Al_zGa_{1-z})_{0.5}In_{0.5}P$ to $(Al_xGa_{1-x})_yIn_{1-y}P$ with $0.05 \leq x \leq 0.9$, $0.1 \leq y \leq 0.95$ and $0.3 \leq z \leq 0.9$.

3. The light-emitting diode having a double hetero structure as claimed in claim 1, wherein said semiconductor substrate is GaAs.

4. The light-emitting diode having a double hetero structure as claimed in claim 1, wherein said first cladding layer comprises AlGaInP.

5. The light-emitting diode having a double hetero structure as claimed in claim 1, wherein said first cladding layer has a composition of $(Al_sGa_{1-s})_{0.5}In_{0.5}P$ with $0.3 \leq s \leq 0.9$.

6. The light-emitting diode having a double hetero structure as claimed in claim 1, wherein said active layer comprises AlGaInP.

7. The light-emitting diode having a double hetero structure as claimed in claim 1, wherein said active layer comprises AlGaInP multiple quantum wells.

8. The light-emitting diode having a double hetero structure as claimed in claim 7, wherein said AlGaInP multiple quantum wells have a composition of $(Al_wGa_{1-w})_{0.5}In_{0.5}P$ with $0 \leq w \leq 0.5$.

9. The light-emitting diode having a double hetero structure as claimed in claim 1, wherein said active layer comprises an AlGaInP single quantum well.

10. The light-emitting diode having a double hetero structure as claimed in claim 9, wherein said AlGaInP single quantum well has a composition of $(Al_wGa_{1-w})_{0.5}In_{0.5}P$ with $0 \leq w \leq 0.5$.

11. The light-emitting diode having a double hetero structure as claimed in claim 1, wherein said first conductivity type is n type and said second conductivity type is p type.

12. The light-emitting diode having a double hetero structure as claimed in claim 1, wherein said first conductivity type is p type and said second conductivity type is n type.

13. A light-emitting diode comprising:

a semiconductor substrate of a first conductivity type;

a first ohmic contact to said semiconductor substrate;

a lower semiconductor layer of a first conductivity type formed on said semiconductor substrate, said lower semiconductor layer being lattice-matched with said semiconductor substrate;

an upper semiconductor layer of a second conductivity type having a graded AlGAInP composition formed on said lower semiconductor layer, said graded AlGAInP composition gradually changing from being lattice-matched to lattice-mismatched with said semiconductor substrate; and a second ohmic contact formed on said upper semiconductor layer.

14. The light-emitting diode as claimed in claim 13, wherein said graded AlGaInP composition of said upper semiconductor layer gradually changes from $(Al_zGa_{1-z})_{0.5}In_{0.5}P$ to $(Al_xGa_{1-x})_yIn_{1-y}P$ with $0.05 \leq x \leq 0.9$, $0.1 \leq y \leq 0.95$ and $0.3 \leq z \leq 0.9$.

15. The light-emitting diode as claimed in claim 13, wherein said semiconductor substrate is GaAs.

16. The light-emitting diode as claimed in claim 13, wherein said lower semiconductor layer comprises AlGaInP.

17. The light-emitting diode as claimed in claim 13, wherein said lower semiconductor layer has a composition of $(Al_sGa_{1-s})_{0.5}In_{0.5}P$ with $0.3 \leq s \leq 0.9$.

18. The light-emitting diode as claimed in claim 13, wherein said first conductivity type is n type and said second conductivity type is p type.

19. The light-emitting diode as claimed in claim 13, wherein said first conductivity type is p type and said second conductivity type is n type.

* * * * *